United States Patent
Bojarczuk, Jr. et al.

(10) Patent No.: US 6,831,339 B2
(45) Date of Patent: Dec. 14, 2004

(54) ALUMINUM NITRIDE AND ALUMINUM OXIDE/ALUMINUM NITRIDE HETEROSTRUCTURE GATE DIELECTRIC STACK BASED FIELD EFFECT TRANSISTORS AND METHOD FOR FORMING SAME

(75) Inventors: Nestor A. Bojarczuk, Jr., Poughkeepsie, NY (US); Eduard Cartier, New York, NY (US); Supratik Guha, Chappaqua, NY (US); Lars-Ake Ragnarsson, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/755,164

(22) Filed: Jan. 8, 2001

(65) Prior Publication Data

US 2002/0090773 A1 Jul. 11, 2002

(51) Int. Cl.[7] .............................................. H01L 29/772
(52) U.S. Cl. ....................... 257/411; 257/410
(58) Field of Search .................................. 257/310, 314, 257/316, 317, 136, 130, 155, 405, 406, 410, 411

(56) References Cited

U.S. PATENT DOCUMENTS

| | | | |
|---|---|---|---|
| 4,097,314 A | | 6/1978 | Schlesier et al. |
| 4,151,537 A | * | 4/1979 | Goldman et al. |
| 4,939,571 A | * | 7/1990 | Nishizawa et al. |
| 5,094,966 A | * | 3/1992 | Yamazaki |
| 5,929,467 A | | 7/1999 | Kawai et al. |
| 6,407,435 B1 | * | 6/2002 | Ma et al. |

* cited by examiner

*Primary Examiner*—Nathan J. Flynn
*Assistant Examiner*—Kevin Quinto
(74) *Attorney, Agent, or Firm*—Wan Yee Cheung, Esq.; McGinn & Gibb, PLLC

(57) ABSTRACT

A structure (e.g., field effect transistor) and a method for making the structure, include a substrate having a source region, a drain region, and a channel region therebetween, an insulating layer disposed over the channel region, the insulating layer including a layer including aluminum nitride disposed over the channel region, and a gate electrode disposed over the insulating layer.

10 Claims, 2 Drawing Sheets

US 6,831,339 B2

ALUMINUM NITRIDE AND ALUMINUM OXIDE/ALUMINUM NITRIDE HETEROSTRUCTURE GATE DIELECTRIC STACK BASED FIELD EFFECT TRANSISTORS AND METHOD FOR FORMING SAME

BACKGROUND OF THE INVENTION

1. Field of the Invention

The present invention generally relates to a semiconductor device, and more particularly to a field effect transistor.

2. Description of the Related Art

Presently, high dielectric constant gate dielectrics for silicon complementary metal oxide semiconductor (CMOS) devices, such as transistors, typically utilize a silicon dioxide gate dielectric. Other gate dielectrics employed in manufacturable devices have contained a silicon oxynitride layer as part of the gate dielectric stack as well. As CMOS devices miniaturize, scaling laws require that the parameter e/d, where e and d are the permittivity and thickness of the dielectric layer respectively, reduce as well. For a fixed gate dielectric material such as silicon dioxide, where the permittivity is 3.8, its thickness therefore must reduce as devices become smaller. However, below a physical thickness of approximately 1.5–1.7 nanometers, the layer starts transmitting an unacceptably high amount of electrical leakage current through it.

An additional, secondary problem that arises when the dielectric layer becomes so thin, is that it also becomes impervious to the diffusion of impurities, or dopant atoms, through it. As a result, such a dielectric layer fails to protect the underlying silicon substrate below it.

SUMMARY OF THE INVENTION

In view of the foregoing and other problems of the conventional methods and structures, an object of the present invention is to provide a method and structure in which a thin gate dielectric is employed in semiconductor devices such as field effect transistors.

Another object is to use a gate dielectric other than silicon dioxide.

In a first aspect of the present invention, a field effect transistor includes a substrate comprising a source region, a drain region, and a channel region therebetween, an insulating layer disposed over the channel region, the insulating layer including a layer including aluminum nitride disposed over the channel region, and a gate electrode disposed over the insulating layer.

In another aspect, preferably the insulating layer further includes a layer of aluminum oxide disposed upon the channel region, the aluminum nitride disposed over or underneath the aluminum oxide.

In another aspect, preferably the insulating layer further includes a layer of silicon dioxide disposed upon the channel region, the aluminum nitride disposed over or underneath the silicon dioxide.

In another aspect, preferably the insulating layer further includes a layer of silicon nitride disposed upon the channel region, the aluminum nitride disposed over or underneath the silicon nitride.

Thus, the structure of the inventive device preferably includes at least one dielectric layer (e.g., aluminum nitride) and more preferably includes two dielectric layers, with the lower one being aluminum oxide (or silicon dioxide or silicon nitride) and the upper one being aluminum nitride. These materials can be either amorphous, or polycrystalline, or single crystalline.

Preferably, the aluminum oxide and aluminum nitride are deposited directly on top of the silicon surface, by any of a variety of techniques.

Hence, the invention provides a high dielectric constant gate dielectric for silicon complementary metal oxide semiconductor (CMOS) transistors that replaces the presently used silicon dioxide gate dielectric. This occurs due to the following reason. As mentioned earlier, the relevant scaling parameter is the ratio e/d, where e is the dielectric permittivity and d is the film thickness. It is noted that when the dielectric is silicon dioxide, e is restricted to a low value of 3.8. On the other hand, the permittivity of aluminum nitride is at least approximately in the range of 9–16. As a result, for an aluminum nitride dielectric layer, the physical thickness can be at least 2.5 times higher than that of a silicon dioxide layer and yet maintain the same e/d ratio. In other words, a silicon dioxide film and an aluminum nitride film that is more than 2.5 times thicker than the silicon dioxide film can be electrically equivalent to one another. Yet, on account of its higher physical thickness, the aluminum nitride layer will conduct a far lower leakage current than the silicon dioxide layer.

As a result, future miniaturized transistors requiring ultra thin gate dielectric layers, can use aluminum nitride-based dielectrics, thereby resulting in smaller, faster devices with low leakage currents.

A thicker physical layer also protects against the diffusion of impurities and dopants through the dielectric layer and protects the underlying silicon substrate.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 3:
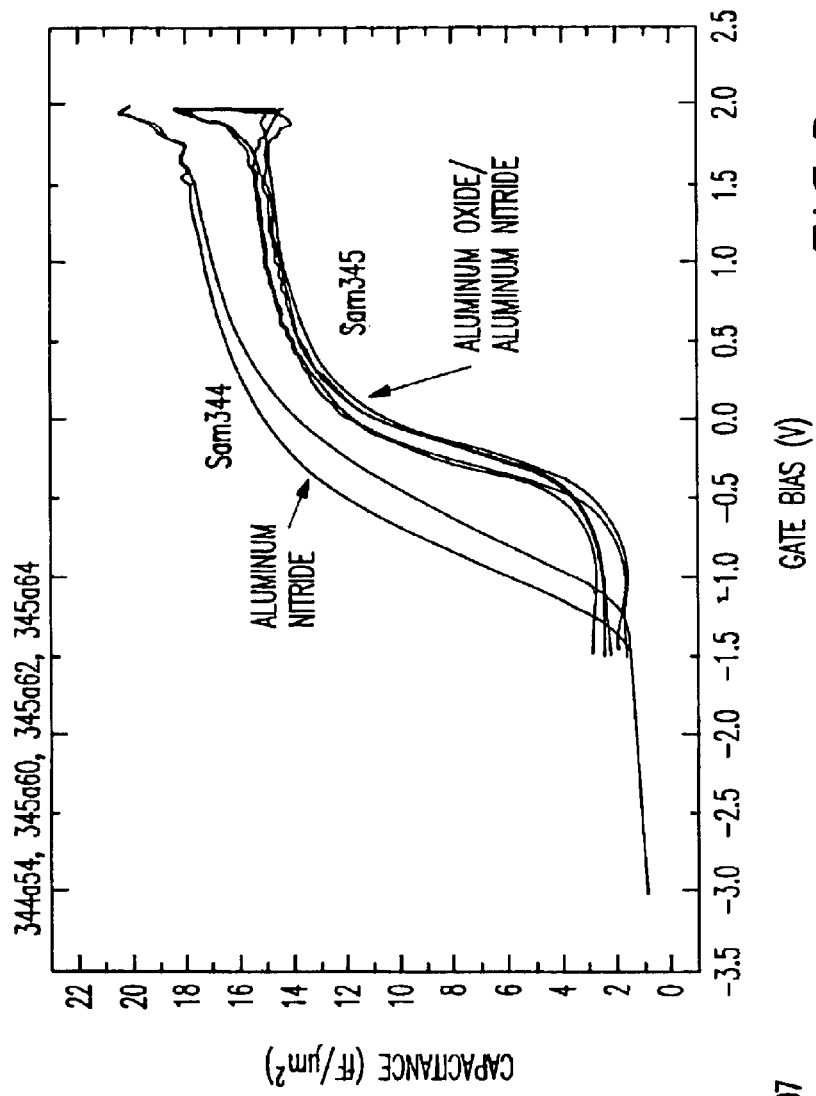
FIG. 3 illustrates a graph showing capacitance/gate voltage plots for aluminum nitride (aluminum nitride) and aluminum oxide/aluminum nitride dielectric heterostructures as employed by the present invention.

Referring now to the drawings, and more particularly to FIGS. 1-4, there are shown preferred embodiments of the method and structures according to the present invention.

Preferred Embodiment

Figure 1:
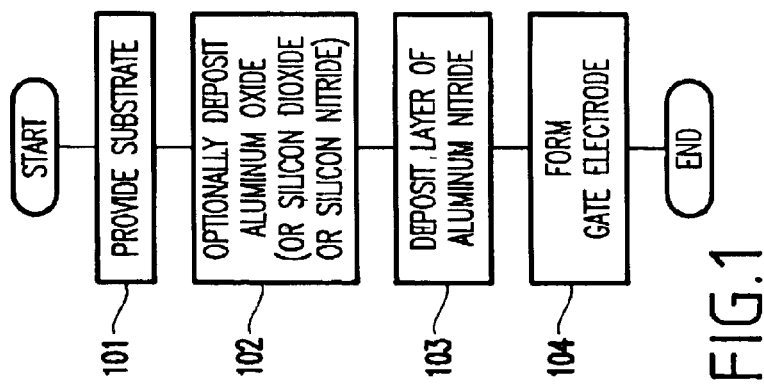
FIG. 1 illustrates a flowchart according to the present invention.

Turning to FIG. 1, a method 100 of forming a semiconductor device such as a multi-terminal device, a field effect transistor, a switching device, an amplification device, etc. is shown.

In step 101, a substrate 101 is provided, having a source region 102, a drain region 103, and a channel region 104 formed between the source and drain regions. The substrate is preferably formed of silicon or the like.

In step 102, optionally, a layer of aluminum oxide (aluminum oxide) 105 (or silicon dioxide or silicon nitride) is deposited on the channel region between the source and drain regions. Again, it is noted that the forming of the aluminum oxide (or silicon dioxide or silicon nitride) 105 is optional. If provided, preferably, the thickness of the aluminum oxide (or silicon dioxide or silicon nitride) is within a range of about 0.1 nm to about 2.0 nm.

In step 103, a layer of aluminum nitride 106 is deposited over the aluminum oxide (or silicon dioxide or silicon nitride) (if earlier provided).

If no aluminum oxide (or silicon dioxide or silicon nitride) 105 has been earlier deposited, then the aluminum nitride 106 is deposited directly upon the channel, it is noted that the forming of the aluminum oxide is optional. Preferably, the thickness of the aluminum nitride is within a range of about 0.1 nm to about 10 nm. It is noted that the thickness does not necessarily change if there is no aluminum oxide layer (or silicon dioxide or silicon nitride) underneath.

In step 104, a gate electrode 107 formed of metal or polysilicon is formed on top of the aluminum nitride layer.

Figure 2:
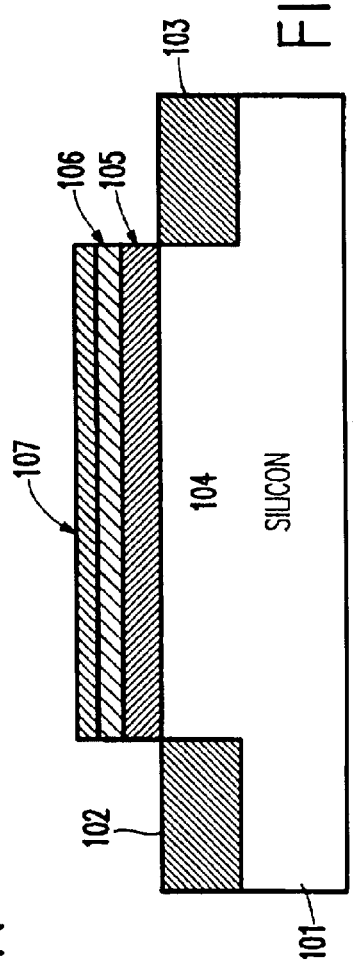
FIG. 2 illustrates a structure produced by the method 100 of FIG. 1 according to the present invention.

Turning to FIG. 2, the structure of the device formed by the method of FIG. 1 is shown. As noted above, the structure includes at least one dielectric layer (e.g., aluminum nitride) or two dielectric layers, with the lower one being aluminum oxide and the upper one being aluminum nitride. These materials can be either amorphous, or polycrystalline, or single crystalline. The situation described in the embodiment is one where the upper layer is aluminum nitride. However, the situation may be reversed, where the first layer is aluminum nitride, followed by silicon dioxide or aluminum oxide or silicon nitride.

The structure shown is that of a standard self-aligned field effect transistor. However, variants of this transistor can also use the same heterostructure dielectric.

As shown in FIG. 2, the aluminum oxide (or silicon dioxide or silicon nitride) and aluminum nitride is deposited directly on top of the Si surface. This can be done by a variety of techniques, including ultra high vacuum physical vapor deposition (UHV PVD).

Turning to FIG. 3, the electrical results (capacitance-voltage, and current-voltage) for two samples are provided and shows that capacitance is indeed present.

That is, the electrical results for aluminum/aluminum nitride/silicon (sam 344) and aluminum/aluminum nitride/aluminum oxide/silicon (sam 345) capacitors that were grown, are shown.

For sample 344 the aluminum nitride thickness was estimated at 5 nm and for sample 345, the aluminum oxide thickness was estimated at 4 nm and the aluminum nitride layer was estimated at 0.8 nm.

The C-V results show a good quality interface that has an equivalent (equivalent to silicon dioxide) thickness of 1.3 nm for sample 344 and 1.5 nm for sample 345 (the inventors have also demonstrated aluminum nitride based dielectric films that are about 0.9 nm (E in equivalent thickness, which is below which silicon dioxide can be acceptably made) with a leakage current that is 7 orders of magnitude lower than that of silicon dioxide at the same equivalent thickness (for sample 345) and 5 orders of magnitude lower for sample 344.

Figure 4:
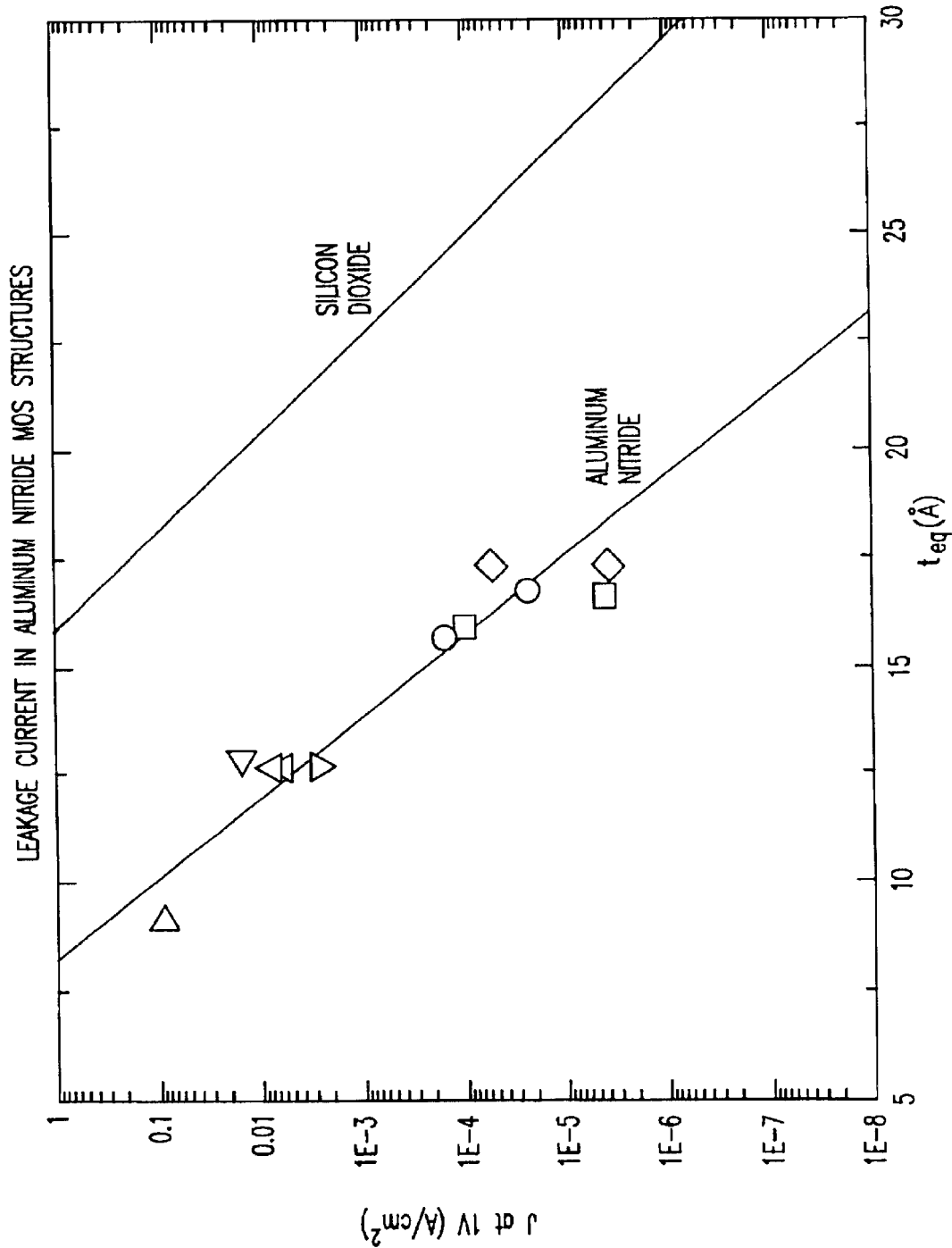
FIG. 4 illustrates a graph showing current density plots for the two samples (e.g., aluminum nitride and aluminum oxide/aluminum nitride dielectric heterostructures) as employed by the present invention, as well as a comparison with silicon dioxide as used in the conventional structures.

FIG. 4 illustrates a graph showing current density plots for the two samples (e.g., aluminum nitride and aluminum oxide/aluminum nitride dielectric heterostructures) as employed by the present invention, as well as a comparison with silicon dioxide as used in the conventional structures.

Thus, FIG. 4 shows that very low current density can be obtained with the two samples of the invention, especially as compared to the conventional gate dielectrics (such as silicon dioxide).

Thus, as described above, with the unique and unobvious aspects of the present invention, the inventive device preferably includes at least one dielectric layer (e.g., aluminum nitride) and more preferably includes two dielectric layers, one of which is aluminum nitride and the other which is Al oxide, silicon dioxide, or silicon nitride.

Hence, the invention provides a high dielectric constant gate dielectric for silicon complementary metal oxide semiconductor (CMOS) transistors that replaces the conventional silicon dioxide (or silicon dioxide or silicon nitride) gate dielectric. This results in an electrically thinner gate dielectric that keeps leakage currents low and provides an interface with Si with good electrical characteristics.

While the invention has been described in terms of several preferred embodiments, those skilled in the art will recognize that the invention can be practiced with modification within the spirit and scope of the appended claims.

What is claimed is:

1. A field effect transistor, comprising:
    a substrate comprising a source region, a drain region, and a channel region between said source region and said drain region;
    an insulating layer disposed over said channel region, said insulating layer comprising an aluminum nitride layer and a silicon dioxide layer disposed over said channel region; and
    a gate electrode disposed over said insulating layer, wherein said aluminum nitride layer has a thickness that is within a range of about 0.1 nm to about 10 nm and is disposed under said silicon dioxide layer.

2. The transistor of claim 1, wherein said insulating layer further comprises an aluminum oxide layer disposed over said channel region, and wherein said aluminum nitride layer is disposed under said aluminum oxide layer.

3. The transistor of claim 1, wherein said insulating layer further comprises a silicon nitride layer disposed over said channel region, and wherein said aluminum nitride layer is disposed under said silicon nitride layer.

4. The transistor of claim 1, wherein said insulating layer further comprises an aluminum oxide layer having a thickness within a range of about 0.1 nm to about 2.0 nm.

5. A semiconductor device, comprising:
    a substrate comprising a source region, a drain region, and a channel region between said source region and said channel region;
    an insulating layer disposed over said channel region, said insulating layer comprising an aluminum nitride layer and a silicon dioxide layer; and
    a gate electrode disposed over said insulating layer, wherein said aluminum nitride layer has a thickness that is within a range of about 0.1 nm to about 10 nm and is disposed under said silicon dioxide layer.

6. The semiconductor device of claim 5, wherein said device comprises a field effect transistor.

7. The device of claim 5, wherein said insulating layer further comprises an aluminum oxide layer having a thickness within a range of about 0.1 nm to about 2.0 nm.

8. A multi-terminal device, comprising:
    a substrate comprising a source region, a drain region, and a channel region between said source region and said channel region;

an insulating layer disposed over said channel region, said insulating layer comprising an aluminum nitride layer and a silicon dioxide layer; and a gate electrode disposed over said insulating layer, wherein said aluminum nitride layer has a thickness that is within a range of about 0.1 nm to about 10 nm and is disposed under said silicon dioxide layer.

9. The multi-terminal device of claim 8, wherein said device comprises a field effect transistor.

10. The device of claim 8, wherein said insulating layer further comprises an aluminum oxide layer having a thickness within a range of about 0.1 nm to about 2.0 nm.

* * * * *